United States Patent
Kiehl

(10) Patent No.: US 7,215,595 B2
(45) Date of Patent: May 8, 2007

(54) MEMORY DEVICE AND METHOD USING A SENSE AMPLIFIER AS A CACHE

(75) Inventor: Oliver Kiehl, Charlotte, VT (US)

(73) Assignee: Infineon Technologies AG, Munich (DE)

( * ) Notice: Subject to any disclaimer, the term of this patent is extended or adjusted under 35 U.S.C. 154(b) by 186 days.

(21) Appl. No.: 10/967,899

(22) Filed: Oct. 18, 2004

(65) Prior Publication Data
US 2005/0111275 A1    May 26, 2005

Related U.S. Application Data

(60) Provisional application No. 60/525,473, filed on Nov. 26, 2003.

(51) Int. Cl.
*G11C 8/18* (2006.01)
(52) U.S. Cl. ............... 365/233; 365/203; 365/202; 365/208; 365/190; 365/189.05
(58) Field of Classification Search ............... 365/190, 365/203, 202, 208, 189.05, 233
See application file for complete search history.

(56) References Cited

U.S. PATENT DOCUMENTS

| | | | | |
|---|---|---|---|---|
| 4,731,758 A | * | 3/1988 | Lam et al. ............ | 365/189.05 |
| 4,967,395 A | * | 10/1990 | Watanabe et al. ......... | 365/203 |
| 5,301,162 A | | 4/1994 | Shimizu ............... | 365/230.03 |
| 5,528,552 A | | 6/1996 | Kamisaki .............. | 365/238.5 |
| 5,566,118 A | | 10/1996 | Shimizu ............... | 365/222 |
| 5,586,078 A | | 12/1996 | Takase et al. ......... | 365/230.03 |
| 5,706,244 A | | 1/1998 | Shimizu ............... | 365/230.03 |
| 5,887,272 A | | 3/1999 | Sartore et al. ........ | 711/105 |
| 6,330,636 B1 | | 12/2001 | Bondurant et al. ...... | 711/105 |
| 6,442,088 B1 | * | 8/2002 | Tsuchida et al. ....... | 365/203 |
| 6,522,563 B2 | | 2/2003 | Tanaka et al. ......... | 365/49 |

FOREIGN PATENT DOCUMENTS

JP    2000-123567    4/2000

OTHER PUBLICATIONS

Gervasi, B.; "Compatible High Availability Cached DDR SDRAM (CHAC DDR)," Sep. 2001.

* cited by examiner

*Primary Examiner*—Andrew Q. Tran
(74) *Attorney, Agent, or Firm*—Slater & Matsil, L.L.P.

(57) ABSTRACT

A memory device includes a pair of complementary bitlines including a first bitline and a second bitline. A bitline precharge block is coupled between the first bitline and the second bitline. A sense amplifier is coupled to both the first bitline and the second bitline and a sense amplifier precharge block is coupled to the sense amplifier. The sense amplifier precharge block can be activated independently from the bitline precharge block. An isolation block is coupled between the pair of complementary bitlines and the bitline precharge block on one side and the sense amplifier and sense amplifier precharge block on another side.

35 Claims, 4 Drawing Sheets

MEMORY DEVICE AND METHOD USING A SENSE AMPLIFIER AS A CACHE

This application claims the benefit of U.S. Provisional Application No. 60/525,473, filed on Nov. 26, 2003, entitled "Cost Efficient Row Cache for DRAMs," which application is hereby incorporated herein by reference.

TECHNICAL FIELD

The present invention relates generally to semiconductor memory devices, and more particularly to a cost efficient row cache for DRAMs.

BACKGROUND

Semiconductor devices are used for integrated circuits in a variety of electrical and electronic applications, such as computers, cellular telephones, radios, and televisions. One particular type of semiconductor device is a semiconductor storage device, such as a random access memory (RAM) device. RAM devices use an electrical charge to store information. Many RAM devices include many storage cells arranged in a two-dimensional array with two sets of select lines, wordlines and bitlines. An individual storage cell is selected by activating its wordline and its bitline. RAM devices are considered "random access" because any memory cell in an array can be accessed directly if the row and column that intersect at that cell are known.

A commonly used form of RAM is known as a dynamic RAM device. Dynamic random access memory (DRAM) has memory cells with a paired transistor and capacitor. One particular type of DRAM device is a synchronous DRAM (SDRAM) device, in which the memory cells are accessed synchronously. Synchronous dynamic random access memory often takes advantage of the burst mode concept to greatly improve performance by staying on the row containing the requested bit and moving rapidly through the columns. To achieve a high speed operation, a double data rate (DDR) architecture is often used, during which two data transfers are made per clock cycle, one upon the rising edge of the clock and the other upon the falling edge.

A number of techniques have been developed to increase the speed with which data can be read from or written to a memory array. For example, virtual channel SDRAMs are memories in which data of a segment from a memory bank are loaded into a memory channel. The segment is selected from a defined row of the memory bank. After buffer storage in the memory channel, the data are output via an interface via the specification of the column address. The use of the memory channel affords the possibility of buffer-storing data from a memory having a relatively long access time into a buffer memory having a short access time and subsequently outputting them. In this way, on statistical average the data can be read more rapidly from the memory. Power is required to transfer these segments into the channel.

U.S. Pat. No. 5,887,272, which is incorporated herein by reference, discloses an enhanced DRAM that contains embedded row registers in the form of latches. The row registers are adjacent to the DRAM array, and when the DRAM comprises a group of sub arrays, the row registers are located between DRAM sub arrays. When used as on-chip cache, these registers hold frequently accessed data. This data corresponds to data stored in the DRAM at a particular address. When an address is supplied to the DRAM, it is compared to the address of the data stored in the cache. If the addresses are the same, then the cache data is read at SRAM speeds. The DRAM is decoupled from this read. The DRAM also remains idle during this cache read unless the system opts to precharge or refresh the DRAM. Refresh or precharge occur concurrently with the cache read. If the addresses are not the same, then the DRAM is accessed and the embedded register is reloaded with the data at that new DRAM address. Asynchronous operation of the DRAM is achieved by decoupling the row registers from the DRAM array, thus allowing the DRAM cells to be pre-charged or refreshed during a read of the row register.

U.S. Pat. No. 5,586,078, which is incorporated herein by reference, discloses a DRAM that includes memory blocks in a form of division of shared sense amplifier configuration in which sub arrays and sense amplifiers serving as cache memories are alternately arranged in the X direction of a memory chip. The memory blocks are arranged in the Y direction. Data lines are formed in parallel with the Y direction for the corresponding sub arrays, for transferring data held in the sense amplifiers corresponding to the sub arrays. I/O pads are arranged in parallel with the X direction, for inputting/outputting data to/from the corresponding sub arrays via the data lines. When the shared sense amplifier configuration and sense amplifier cache system are achieved in a small area of the DRAM, the hit rate of the cache memories is increased, and data can be transferred at high speed by shortening data paths formed in the memory chip.

U.S. Pat. No. 5,528,552, which is incorporated herein by reference, discloses a dynamic random access memory device that causes sense amplifier circuits to serve as a cache memory for sequentially delivering data bits in the sense amplifier circuits, and a row address buffer unit is controlled independently of the sense amplifier circuits so as to change the row address signal without canceling the data bits in the sense amplifier circuits.

U.S. Pat. No. 5,566,118, which is incorporated herein by reference, discloses a dynamic DRAM device including a plurality of memory cell blocks associated with sense amplifier arrays as cache memories, and registers for storing addresses of the memory cell blocks to indicate the contents of the sense amplifiers. A refresh address for a self-refresh mode is sequentially generated to perform a refresh operation upon the memory cell blocks. When the refresh address coincides with a predetermined value, data of the memory cell blocks is read by using an address of one of the registers and is restored in a corresponding sense amplifier array.

U.S. Pat. No. 5,706,244, which is incorporated herein by reference, discloses a semiconductor dynamic random access memory device that has shared sense amplifier units used for not only amplification of data bits but also as a cache storage. A cache system incorporated in the semiconductor dynamic random access memory device individually controls the sense amplifier units to determine whether to allow an access to the selected sense amplifier unit, thereby enhancing the hit ratio.

SUMMARY OF THE INVENTION

Embodiments of the present invention achieve technical advantages as a system and method for implementing a cost-efficient row cache for dynamic memories. In one embodiment, the sense amplifiers that are already needed for DRAM operation are used as the cache. As a result no additional sense amplifiers or other storage units are needed. This feature can be implemented by having the sense amplifiers and the bitlines be precharged/equalized independently.

In a first embodiment, a memory device includes a pair of complementary bitlines including a first bitline and a second bitline. A bitline precharge block is coupled between the first bitline and the second bitline. A sense amplifier is coupled to both the first bitline and the second bitline and a sense amplifier precharge block is coupled to the sense amplifier. The sense amplifier precharge block can be activated independently from the bitline precharge block. An isolation block is coupled between the pair of complementary bitlines and the bitline precharge block on one side and the sense amplifier and sense amplifier precharge block on another side.

A method of operating the memory device includes initially precharging the complementary pair of bitlines. A wordline is then activated and a difference between the bitlines is sensed by a sense amplifier causing a differential voltage to be stored on a pair of sense amplifier bitlines. To read data out, the sense amplifier is coupled to a primary data line. The wordline can then be deactivated and the bitlines isolated from the sense amplifier. At this point, the bitlines can be precharged while maintaining the differential voltage on the pair of sense amplifier bitlines. At a time subsequent to a start of the precharging of the complementary pair of bitlines, the sense amplifier bitlines may be precharged.

Aspects of the present invention provide a number advantages over prior art methodologies. For example, the preferred embodiment can be implemented with no power penalty and with no timing penalty. In most embodiments, there is no or only marginal area penalty. It is advantageous for performance for the data read from a row of cells to be stored and available even if the wordline is restored. In this manner, an inexpensive cache can be provided.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

DRAM device architecture and design implementation issues will first be discussed, followed by a description of preferred embodiments of the present invention and a discussion of some advantages thereof. Although each figure shows certain elements for purposes of discussion, many other components of a memory device may be present in the semiconductor devices shown.

Figure 1:
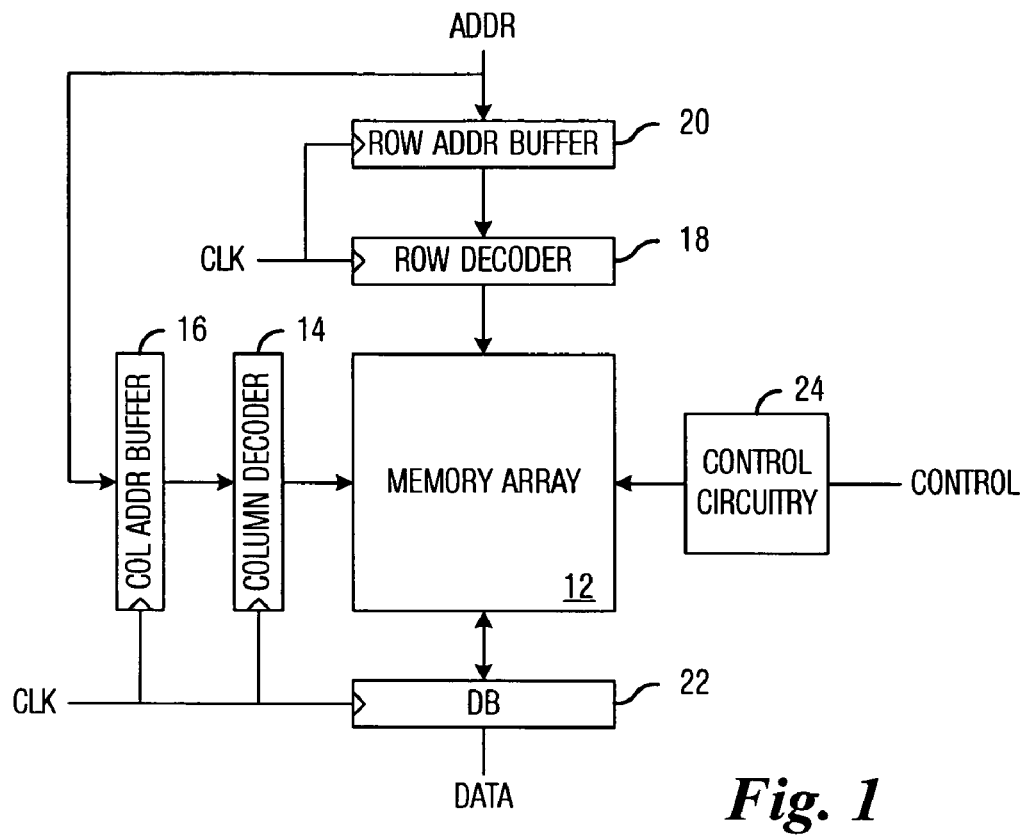
FIG. 1 illustrates a block diagram of a DRAM device.

FIG. 1 illustrates a functional block diagram of a DRAM device 10. To access a particular cell in the array 12, an address signal ADDR is transmitted to a column address buffer 16 and row address buffer 20. In a typical DRAM chip, the column address and row address share external contacts (e.g., pins or balls) so that the row address is received at a first time and the column address is received at a second time. The ADDR signals may be transmitted by an external device, such as a memory controller (not shown), for example.

The column address buffer 16 and row address buffer 20 are adapted to buffer the address signal. The outputs of the column address buffer 16 and row address buffer 20 are coupled to a column decoder 14 and row decoder 18, respectively. The column and row decoders 14 and 18 are adapted to decode the signals received from the column address buffer 16 and row address buffer 20, respectively, to provide the signal input to the array 12 such that the selected row and column can be selected.

In FIG. 1, the decoders 14 and 18 are shown as single blocks. It should be understood, however, that the decoders might carry out several levels of predecoding and decoding. Some, all, or none of these levels may be clocked.

Data that is addressed in memory 10 will be written into memory 12 or read from memory 12 via data buffer (DB) 22. Once again, this portion of FIG. 1 is simplified. The data buffer 22 and the associated line are provided to represent the read and write path, which may include a large number of lines and other components (e.g., secondary sense amplifiers).

FIG. 1 also shows a clock input CLK to illustrate that the memory device could be synchronous. To further illustrate this point the clock signal CLK is provided to each of the blocks. It is understood that while the external clock could be provided to various elements in the array, a number of clocking signals, which may operate continuously or only when needed, may be derived from the clock.

Also shown in FIG. 1 is control circuitry 24, which is a simplified illustration of control signals. A number of control signals, referred to generically as CONTROL, are received from a source external to the memory device 10 (e.g., from a memory controller, not shown). The control circuitry block 24 is shown as being coupled to the array, where it will provide various control signals such as SEL, PRCH, and SAPRCH, as will be described below. As discussed below, these signals can be controlled to provide a low-cost but effective cache using the already existing sense amplifiers.

Figure 2:
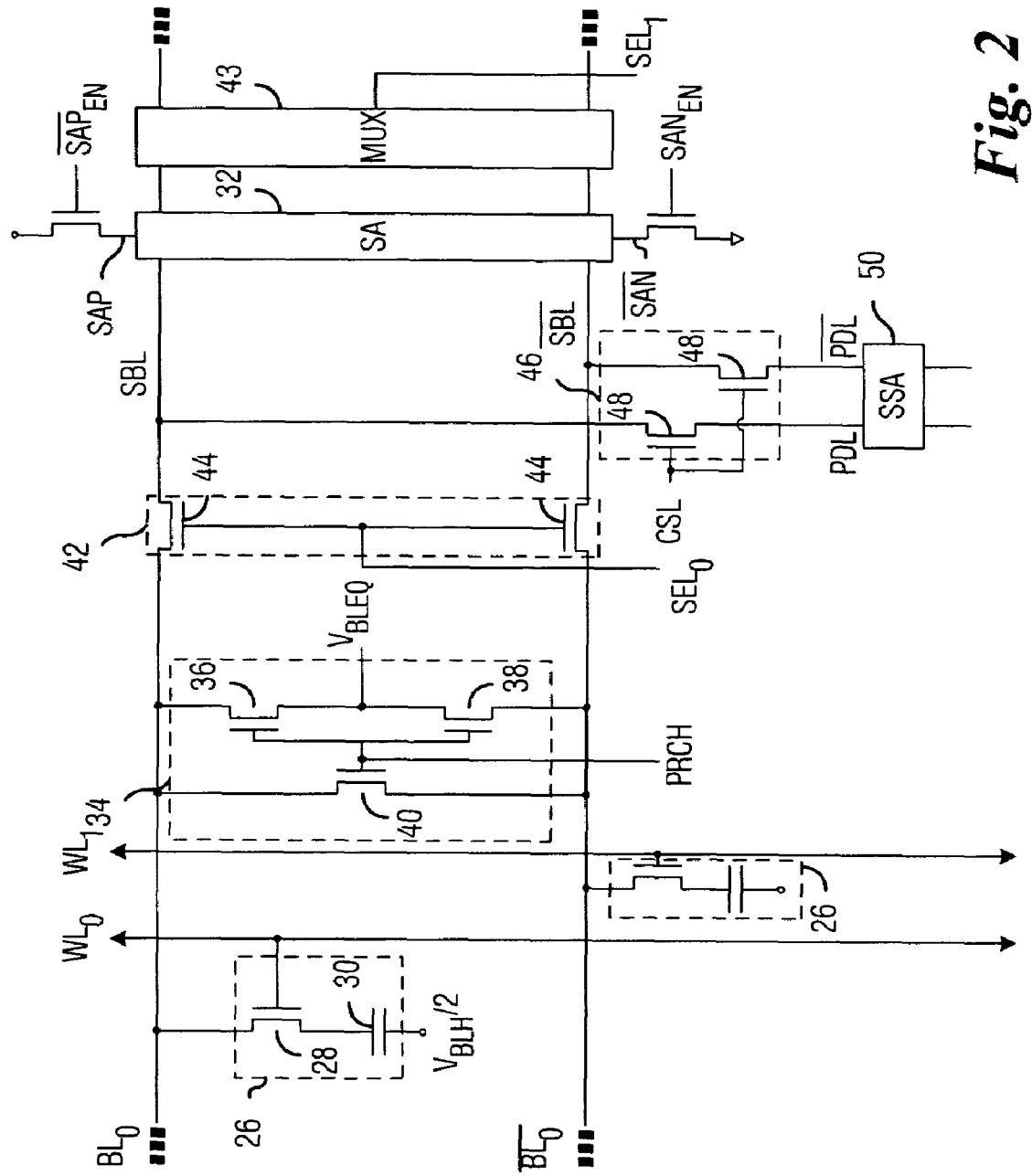
FIG. 2 illustrates an array portion of a DRAM device.

FIG. 2 shows more detail of a small portion of the memory array 12. As illustrated, memory array 12 includes a plurality of memory cells 26 arranged in a matrix-type architecture or array. Each cell 26 includes an access transistor 28, typically an n-channel metal oxide semiconductor field effect transistor (MOSFET), coupled in series with a capacitor 30. The gate of each access transistor 28 is coupled to a wordline $WL_0$, and one source/drain region of the transistor 28 is coupled to a bitline $BL_0$, as shown. A second source/drain region of the transistor 28 (e.g., the storage node) is coupled to one end of the storage capacitor 30. The other end of the storage capacitor 30 is coupled to a reference voltage, such as $V_{BHL}/2$, for example. The simplified example of FIG. 2 shows only two memory cells. It is readily understood that a practical DRAM device may contain a plurality of cells, perhaps many millions or even billions of memory cells arranged in arrays of rows and columns.

The bitlines are organized as bitline pairs, e.g., $BL_0$ and $BL_0\#$ (the nomenclature BL# is used to refer to BL-bar, which is shown in the figures with a line above the symbol). Each bitline pair $BL_0/BL_0\#$ is coupled to a sense amplifier 32, which is configured to amplify the voltage difference between the two bitlines in a pair. Traditional mid-level sensing is accomplished using latch-type sense amplifiers with a bitline high level ($V_{BLH}$) of 1.5 V, for example. Any differential sense amplifier could be used to accomplish this task.

Equalization and pre-charge circuitry 34 is also coupled between each bitline in a pair to provide the proper initial voltages on the bitlines. In this particular example, the circuitry 34 includes precharge transistors 36 and 38, which are each coupled between one of the bitlines in the complementary pair BL/BL# and an equalization voltage node $V_{BLEQ}$, which can be held at $V_{BHL}/2$, for example. The circuitry 34 also includes an equalization transistor 40 that is coupled between the bitlines so that the bitlines will be electrically shorted during precharge.

The high voltage on the wordline will cause the pass transistor 28 of each memory cell 26 coupled to that wordline to be conductive. Accordingly, charge will travel either to the bitline BL (or BL#) from the memory cell 26 (in the case of a physical one, e.g., $V_{BLH}$) or from the bitline BL (or BL#) to the memory cell 26 (in the case of a physical zero, e.g., 0V). The sense amplifier 32, when activated by enable signals $SAP_{EN}\#$ and $SAN_{EN}$, will sense the physical one or zero and generate a differential voltage that corresponds with the signal read from the cell 26. The enable signals $SAP_{EN}\#$ and $SAN_{EN}$ serve to couple the nodes SAP and SAN# to the appropriate supply voltage.

A bit switch 46 includes a pair of pass transistors 48 that is provided between each column (i.e., bitline pair BL/BL#) and the primary data lines (PDL) or local input/output lines. Since the sense amplifier 32 associated with each column (only one column with $BL_0/BL_0\#$ is shown) will generate a bit that corresponds to a cell associated with the selected row (as determined by the selected wordline), a column select signal CSL is provided to a bit switch 46. The bit switch 46 selects one of the columns, which is coupled to the PDL (typically a differential pair, e.g., PDL and PDL#). Many architectures will include multiple I/O's in which case a single select signal CSL is coupled to the bit switch of more than one column, each of which is coupled to a primary data line.

A secondary sense amplifier (SSA) 50 is coupled to the PDL lines to amplify the voltage level and drive the signal across the chip. The SSA 50 is timed based on the logic that enabled the CSL. In a preferred embodiment, this circuitry contains not only a sense amplifier for reading but also write buffers for driving the I/O lines. Basically the "SSA" can be in one of three states: precharged (if no read or write), reading, or writing.

When a read command is issued, the CSLs get activated, and the sense amplifiers (basically clocked latches) are coupled to the primary data lines. The clocking of the latches is synchronized with the CSL activation. When a write command is issued, the CSLs are again activated, but the sense amplifier is decoupled from the I/O lines and the write drivers are coupled instead. As in the case of a read, the clocking of the drivers is synchronized with the CSL activation.

A write cycle will be performed in a similar fashion as a read. First, a wordline has been previously activated, e.g., a bank is active. Subsequently, data is placed on the I/O lines and the CSLs are activated. This overwrites the primary sense amplifier, causing the BL and BL# to change (only in the case of a different data state) and the data is transferred to the memory cell.

To be compliant with international standards for reading or writing data in or out of SDRAM devices, a sequence of timings must be met. For example, the majority of DRAMs sold today comply with the standards set by JEDEC (once known as the Joint Electron Device Engineering Council). See e.g., JEDEC Double Data Rate (DDR) SDRAM Specifications JESD79, DDR3332.5-3.3 and DDR 266 2-2-2, which are incorporated herein by reference.

In the illustrated architecture, a multiplexer circuit 42 includes an additional pair of pass transistors 44 to isolate the sense amplifier (SA) 32 from bitlines $BL_0$ and BL0#. The portion of the bitline on the sense amplifier side of the transistors 44 can be referred to as the sense amplifier bitlines SBL/SBL#. By using pass transistors 44, the sense amplifier 32 can be shared by multiple bitlines, thus reducing the total number of sense amplifiers required for the DRAM device. For example, another multiplexer circuit 43 is located to the right of sense amplifier 32 in FIG. 2. The block select signals $SEL_0$ and $SEL_1$ are used to activate multiplexer circuit 42/43 so that the array can use the sense amplifiers to read and write data. As discussed below, this circuitry can also be used to allow the sense amplifiers to serve as a row cache for reading data more quickly from the array.

Figure 3:
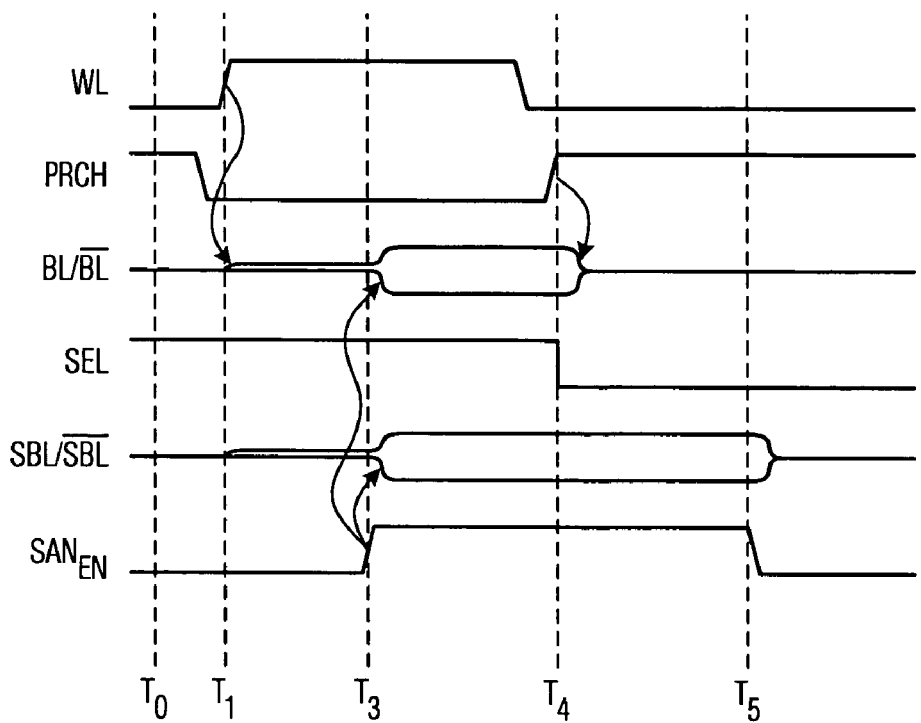
FIG. 3 shows a timing diagram for a read cycle of a DRAM.

FIG. 3 illustrates a timing diagram that can be used to describe the operation of a read cycle for a DRAM memory device 10. At the initial state (time $t_0$), bitline pair BL/BL# and sense amplifier bitlines SBL/SBL# are in a precharged state. Accordingly, the precharge signal PRCH is active, all of the wordlines WL are inactive, and sense amplifier 32 is inactive ($SAP_{EN}\#/SAN_{EN}$ are inactive). Both select lines SEL0 and SEL1 are high (so that sense amplifier 32 is coupled to both pairs of adjacent bitlines).

The read cycle is started when an activate command is received. The precharge signal PRCH is deactivated and one of the SEL lines (responsive to the block information provided by the row address) goes inactive. The row decoder causes one of the wordlines WL to go high at time $t_1$. When the wordline WL goes high, a small amount of charge is transferred between the selected memory cell and it's corresponding bitline so that the bitlines BL and BL# (and the sense amplifier bitlines SBL and SBL#) have a small voltage difference.

The sense amplifier is then activated at time $t_3$. At this time, the signals $SAP_{EN}\#$ and $SAN_{EN}$ cause the sense amplifier node SAP to be coupled to the high voltage node (e.g., $V_{BLH}$) and the sense amplifier node SAN# to be coupled to the low voltage node (e.g., ground). This activation causes the bitlines BL and BL#, along with the sense amplifier lines SBL and SBL#, to reach their full differential. At this point, the CSL signal (not shown in FIG. 3) can be activated and the read data transferred to the primary data lines.

After the data is read, a conventional DRAM would begin the precharge cycle for both the bitlines BL/BL# and the sense amplifier lines SBL/SBL#, or leave both active in case the next read is from a memory cell coupled to the already activated wordline WL. In the preferred embodiment of the present invention, however, the bitlines BL/BL# and the sense amplifier lines SBL/SBL# are precharged independently. This feature allows the sense amplifier lines to act like a row cache while allowing the bitlines to precharge, thus saving time on the next read cycle.

This independent precharge capability can be seen in the timing diagram of FIG. 3. At time $t_4$, the block select line SEL is deactivated. This causes the bitlines BL/BL# to be isolated from the sense amplifier 32. Accordingly, the precharge signal PRCH can be activated causing the bitlines BL/BL# to be precharged. At the same time, the sense amplifier 32 can remain active, i.e., enable signals $SAP_{EN}\#$/$SAN_{EN}$ remain active. Accordingly, new column addresses can be provided to the memory and data can be very quickly provided by activating the appropriate column select signal CSL to provide new data to the primary data lines. The sense amplifier can be precharged at a later time by deactivating the enable signals $SAP_{EN}\#$/$SAN_{EN}$ and then activating the block select SEL, as shown at time $t_5$.

In this embodiment, the memory controller (not shown and typically "off-chip") will keep track of the contents of the "cache." When data that are already in the cache (cache hit) need to be accessed then a normal read operation can be performed. If the data required are in a wordline, that is not in the cache (cache miss) then the new row address will be supplied to the memory device. The sense amplifier needs to be precharged, e.g., by either connecting them to the precharged BL's or activating the separate SBL/SBL# precharge devices. This precharge has to be released before the WL gets activated. Note here that the precharge time for the sense amplifier 32 is much shorter than precharge/restore time of a conventional DRAM, thus reducing the cache miss penalty.

In an alternate embodiment, the memory device 10 will receive a row address when a new read cycle begins. If the row address relates to a row already in the row cache (sense amplifiers), then there will be a cache hit and the memory can await a new column address. If the row address relates to a different row, thus creating a cache miss, the sense amplifiers can be precharged and a read cycle, as described above, will begin. In the case of a cache miss, the time to precharge is relatively short, e.g., less than one clock cycle.

For a write cycle, data is received from a source external to the memory device 10 and input to the write buffers (not shown; see block 22 in FIG. 1). This data can be written into the sense amplifier 32 with the multiplexer 42 isolating the sense amplifier 32 from the bitlines BL/BL#. This data can be written back to the bitlines and into the cell by inactivating the precharge PRCH and then connecting the sense amplifier bitlines SBL/SBL# to the bitlines BL/BL# via the multiplexer 42. The appropriate wordline WL can then be activated so that the bit can be written to a storage cell. In the preferred embodiment, the sense amplifiers 32 are not operated as a write cache. This design decision eliminates the need for a dirty bit to track when the sense amplifier data may not match the cell data.

Figure 4:
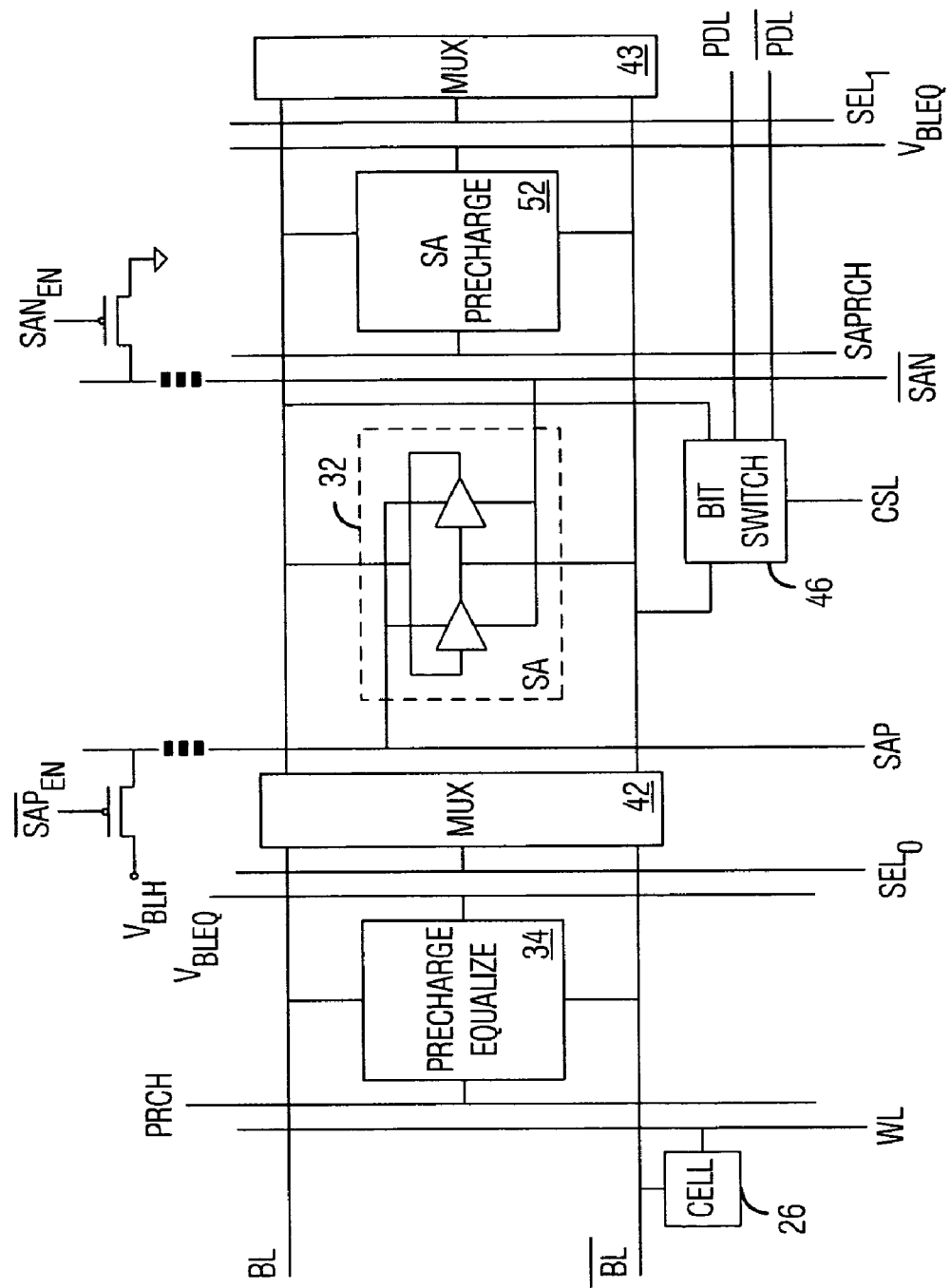
FIG. 4 illustrates an array portion of an alternate embodiment DRAM device.

FIG. 4 shows an alternate embodiment of the circuit. This circuit is similar to that of FIG. 2 but also includes a separate sense amplifier precharge circuit 52. This circuit can be identical in structure as the precharge/equalization circuitry 34 or can be different. For example, circuit 52 can perform precharge without equalization (e.g., have transistors 36 and 38 but not transistor 40 in FIG. 2) or equalization without precharge (e.g., have transistor 40 but not transistors 36 and 38 in FIG. 2). Accordingly, precharge circuit 52 is shown being coupled to the equalization voltage node $V_{BLEQ}$ (e.g., $V_{BLH}/2$).

The sense amplifier precharge circuit 52 is operated independently of the bitline precharge circuit 34. This feature allows for the bitlines to precharge while the sense amplifier operates as a row cache. Advantageously over the previous embodiment, the inclusion of a separate sense amplifier circuit allows the sense amplifier to be precharged more quickly, thus allowing a subsequent read (or write) cycle to operate more quickly. It also allows the sense amplifier precharge operation to occur while the wordline is already activating. In this case, the select signal SEL should become active once the sense amplifier is precharged, but while the cell is already transferring cell charge from or onto the bitline.

Figure 5:
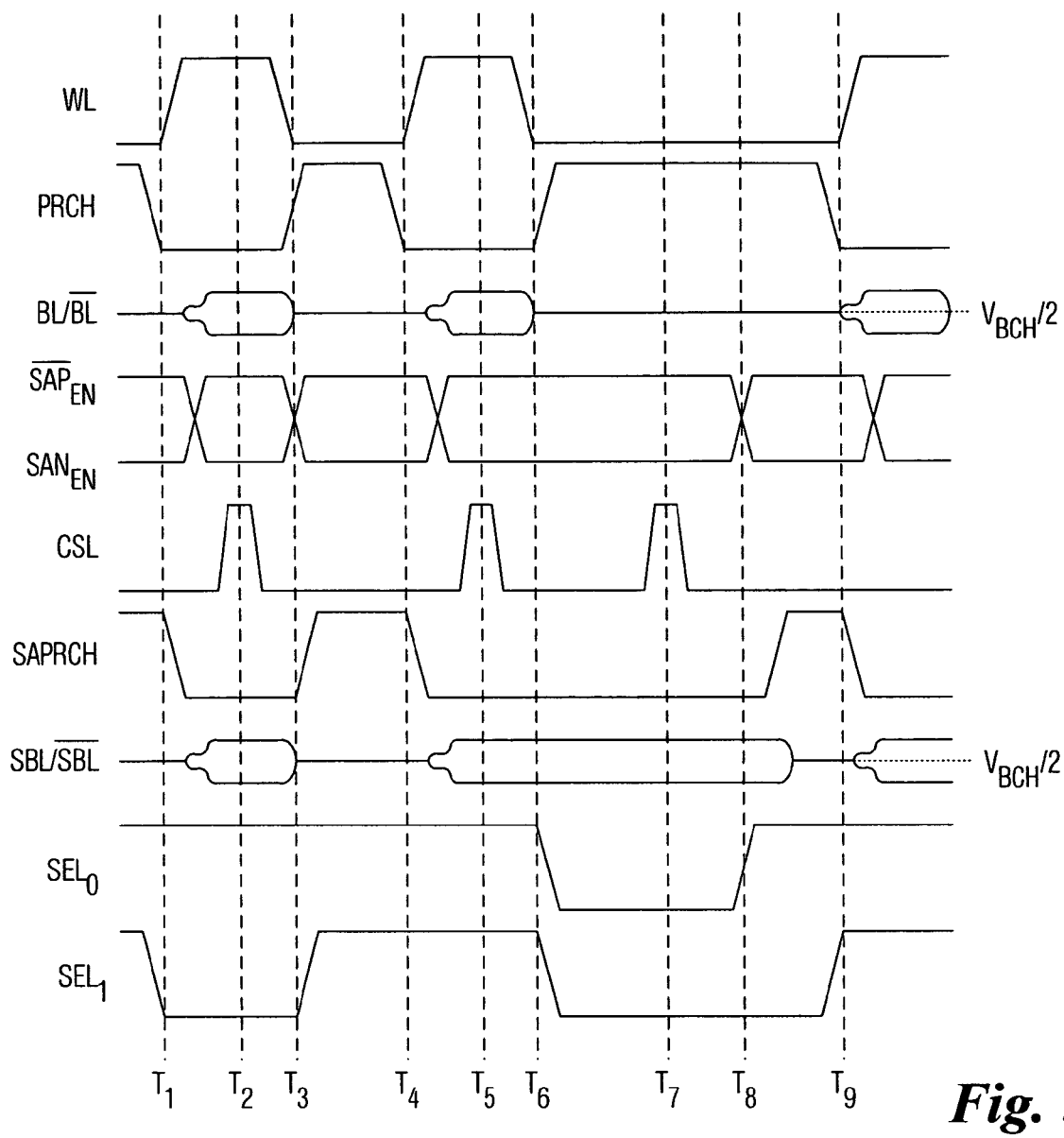
FIG. 5 shows a timing diagram for a read cycle of the embodiment of FIG. 4.

FIG. 5 shows a timing diagram for the circuit of FIG. 4. This diagram shows the timing of the sense amplifier precharge signal SAPRCH along with the other signals shown in FIG. 3.

Summarizing, the timing of this embodiment of the invention can be listed as:

T1—Normal Activation
Precharge is turned off by deactivating PRCH and SAPRCH
Unwanted bitlines are deselected
Wordline WL is activated
A small signal develops on the bitlines BL/BL# and SBL/SBL#
$SAP_{EN}\#$/$SAN_{EN}$ activate sensing
A large signal develops on the bitlines BL/BL# and SBL/SBL#
T2—Read
Column select signal CSL goes high
Sense amplifier information is transferred to data lines PDL/PDL# (and to SSA)
T3—Normal Precharge
Wordline WL goes low
Sense amplifier select activation signals $SAP_{EN}\#$/$SAN_{EN}$ are deactivated
Precharge signal PRCH is turned on
All sense amplifier bitlines SBL/SBL# are connected to $V_{BLEQ}$ (activate SAPRCH)
T4—Normal Activation
Same as T1 above
T5—Read
Same as T2 above
T6—Precharge, while keeping SA latched
Bring down wordline WL
Disconnect bitlines BL/BL# and SBL/SBL# by bringing $SEL_0$ down
Precharge bitlines BL/BL#
Sense amplifier bitlines SBL/SBL# remain in the read out state
T7—Read from SA cache while BL is precharged
Same as T2 above
T8—Precharge SA (e.g., a cache miss situation)
Deactivate sense amplifier ($SAP_{EN}\#$/$SAN_{EN}$ inactive)
Connect bitlines BL/BL# and SBL/SBL# by bringing $SEL_0$ high
The SBL nodes get precharged to $V_{BLEQ}$ (activate SAPRCH)
T9—Normal activation Same as T1 above (T8 and T9 can also be a "cache miss activation")

Figure 6:
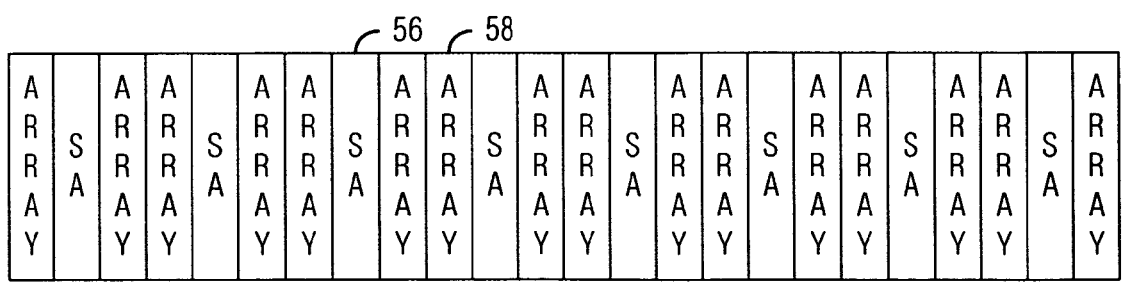
FIG. 6 illustrates a block diagram showing the layout of the array and sense amplifiers.

FIG. 6 shows a portion 54 of the memory device 10. A typical DRAM may include a number (e.g., four) of these portions. As shown, the memory portion 54 includes sixteen array blocks 58. Between every two adjacent blocks 58 is a sense amplifier stripe 56. The sense amplifier stripe 56 includes a number of sense amplifiers 32, as described above. A multiplexer circuit 42 (see FIG. 2 or FIG. 4) allows for the sharing of the sense amplifiers 32 between bitline pairs in two adjacent blocks 58. Alternatively, for layout purposes, a sense amplifier stripe 56 may be included between each pair of blocks 58. The sense amplifiers could be shared such that alternating bitline pairs are coupled to the sense amplifiers on the left or on the right.

In a particular embodiment, the DRAM device 10 includes four 128 Mb memory quadrants 54, each of which corresponds to an individual logical bank. Each 128 Mb bank may be physically separated into a number of blocks 58, e.g., 16 blocks, each with 8 Mb in a folded bitline configuration. There may be 512 bits (e.g., memory cells 26) for each bitline. A block 58 may include 1024 wordlines. The blocks 58 can be separated by stripes 56, which each include 4 k sense amplifiers and are shared by neighboring blocks. Each block 58 may then be divided into 16 sections by row gaps with each section containing 512 kb. A local data line (LDQ) spans two sections so that, in the column direction, the sections are paired, forming eight column segments. This is just one example of many configurations that are possible.

In operation, it is typical that only a fraction, e.g., one fourth or one eighth, of the sense amplifier stripes 56 are active in an activated bank 54. With the scheme described herein, all those sense amplifier stripes can be used as row caches. This can be implemented easily by use of the appropriate selecting means.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory device comprising:
   a pair of complementary bitlines including a first bitline and a second bitline;
   a bitline precharge block coupled between the first bitline and the second bitline;
   a sense amplifier coupled to both the first bitline and the second bitline;
   a sense amplifier precharge block coupled to the sense amplifier, the sense amplifier precharge block being activated independently from the bitline precharge block;
   an isolation block coupled between the pair of complementary bitlines and the bitline precharge block on one side and the sense amplifier and sense amplifier precharge block on another side; and
   control circuitry providing a bitline precharge signal to the bitline precharge block, a sense amplifier precharge signal to the sense amplifier precharge block, a sense amplifier enable signal to the sense amplifier and a select signal to the isolation block, wherein the control circuitry causes the sense amplifier to operate as a cache by:
      causing the select signal and the sense amplifier enable signal to be active while the bitline precharge signal and the sense amplifier precharge signal are inactive so that a differential signal from the pair of complementary bitlines will be held in the sense amplifier; and
      subsequently, causing the select signal to be inactive and the bitline precharge signal to be active while the sense amplifier enable signal remains active and the sense amplifier precharge signal remains inactive such that the pair of complementary bitlines are precharged while the sense amplifier continues to hold the differential signal.

2. The device of claim 1 and further comprising a first plurality of memory cells coupled to the first bitline and a second plurality of memory cells coupled to the second bitline, each of the memory cells including a capacitor and an access transistor with a current path coupled between the capacitor and a bitline.

3. The device of claim 2 wherein at least 512 memory cells are coupled to each bitline.

4. The device of claim 3 wherein the memory device comprises a dynamic random access memory device that has at least 500 million memory cells.

5. The device of claim 1 wherein the bitline precharge block comprises:
   a first transistor coupled between the first bitline and the second bitline;
   a second transistor coupled between the first bitline and a precharge voltage node; and
   a third transistor coupled between the second bitline and the precharge voltage node.

6. The device of claim 1 wherein the sense amplifier precharge block comprises:
   a first transistor coupled between the first bitline and the second bitline;
   a second transistor coupled between the first bitline and a precharge voltage node; and
   a third transistor coupled between the second bitline and the precharge voltage node.

7. The device of claim 1 and further comprising:
   a second pair of complementary bitlines including a third bitline and a fourth bitline;
   a second bitline precharge block coupled between the third bitline and the fourth bitline; and
   a second isolation block coupled between the second pair of complementary bitlines and the second bitline precharge block on one side and the sense amplifier and sense amplifier precharge block on another side.

8. A method of operating a memory device, the method comprising:
   initially precharging a complementary pair of bitlines;
   activating a wordline, the wordline being coupled to a memory cell that is coupled to one of the bitlines of the complementary pair;
   sensing a difference between bitlines in the complementary pair, the sensing being performed by a sense amplifier and a differential voltage being stored on a pair of sense amplifier bitlines;
   coupling the sense amplifier to a primary data line;
   inactivating the wordline;
   isolating the complementary pair of bitlines from the pair of sense amplifier bitlines;
   precharging the complementary pair of bitlines while maintaining the differential voltage on the pair of sense amplifier bitlines;
   at a time subsequent to a start of the precharging of the complementary pair of bitlines, precharging the sense amplifier bitlines.

9. The method of claim 8 wherein sensing a difference between bitlines comprises enabling a power supply to be coupled to the sense amplifier.

10. The method of claim 8 wherein initially precharging and precharging the complementary pair of bitlines comprise applying a precharge voltage to both bitlines in the complementary pair and coupling both bitlines in the pair to each other.

11. The method of claim 8 wherein precharging the sense amplifier bitlines comprises activating a sense amplifier precharge circuit.

12. The method of claim 11 wherein precharging the complementary pair of bitlines comprises activating a bitline precharge circuit, the bitline precharge circuit being isolated from the sense amplifier precharge circuit.

13. The method of claim 8 wherein precharging the sense amplifier bitlines comprises coupling the sense amplifier bitlines to the complementary pair of bitlines.

14. The method of claim 8 wherein initially precharging the complementary pair of bitlines comprises:
disabling a precharge circuit;
disconnecting a non-selected bitline from the sense amplifier;
coupling the complementary pair of bitlines to the pair of sense amplifier bitlines; and
precharging the complementary pair of bitlines and the sense amplifier bitlines.

15. The method of claim 14 wherein coupling the sense amplifier to the primary data line comprises sequentially coupling different sense amplifiers to the primary data line.

16. The method of claim 8 and further comprising writing data from the primary data line to the sense amplifier bitlines.

17. A dynamic random access memory device comprising:
an array of memory cells arranged in rows and columns, each memory cell including a pass transistor coupled in series with a storage capacitor;
a plurality of wordlines, each wordline coupled to memory cells along a row;
a plurality of bitlines arranged in complementary pairs, each bitline coupled to memory cells along a column;
a plurality of bitline precharge blocks, each bitline precharge block coupled between bitlines in one of the complementary pairs of bitlines;
a plurality of sense amplifiers, each sense amplifier coupled to two of the complementary pairs of bitlines;
a plurality of multiplexer circuits, each multiplexer circuit including a first isolation block coupled between one of the sense amplifiers and one of the two complementary pairs of bitlines, each multiplexer circuit further comprising a second isolation block coupled to the other of the two complementary pairs of bitlines;
control circuitry coupled to the wordlines, the bitline precharge blocks, the sense amplifiers, and the multiplexer circuits, the control circuitry causing the sense amplifiers to act as a row cache by causing data to be read out from memory cells coupled to one of the wordlines to be stored in the sense amplifiers while the bitlines coupled to those memory cells are being precharged.

18. The device of claim 17 wherein the array includes at least 128 million memory cells, the array being physically separated into at least 8 blocks, each block including at least 1024 columns and 1024 rows.

19. The device of claim 18 wherein each array includes at least 16 blocks, each block including at least 1024 wordlines and each bitline being coupled to at least 512 memory cells, wherein adjacent blocks are separated by stripes of sense amplifiers, each stripe including at least 4000 sense amplifiers.

20. The device of claim 18 wherein the array comprises one quadrant of a memory device that includes four quadrants.

21. The device of claim 17, further comprising a plurality of sense amplifier precharge blocks, each sense amplifier precharge block coupled to one of the sense amplifiers and capable of being isolated from both of the two complementary pairs of bitlines by the multiplexer circuit, the sense amplifier precharge blocks being activated independently from the bitline precharge blocks.

22. A memory device comprising:
a pair of complementary bitlines including a first bitline and a second bitline;
a memory cell coupled to one of the pair of complementary bitlines;
means for precharging the first and second bitlines;
a sense amplifier coupled to both the first bitline and the second bitline;
means for precharging the sense amplifier;
means for isolating the pair of complementary bitlines and the sense amplifier; and
means for controlling the memory device so that the sense amplifier caches data read from the memory cell while the pair of complementary bitlines is being precharged by the means for precharging the first and second bitlines.

23. The device of claim 22, wherein the memory cell includes a capacitor and an access transistor with a current path coupled between the capacitor and a bitline.

24. The device of claim 22 and further comprising:
a second pair of complementary bitlines including a third bitline and a fourth bitline;
a second means for precharging coupled between the third bitline and the fourth bitline; and
means for isolating the second pair of complementary bitlines from the sense amplifier.

25. A method of reading data from a dynamic random access memory device, the dynamic random access memory device comprising an array of memory cells arranged in rows and columns, each memory cell including a pass transistor coupled in series with a storage capacitor, each memory cell coupled to one of a plurality of wordlines and one of a plurality of bitlines, the bitlines being arranged in complementary pairs, each complementary pair further coupled to a sense amplifier, the device further including a bitline precharge block coupled to each pair of bitlines and a sense amplifier precharge block coupled to each sense amplifier, the method comprising:
causing a plurality of complementary pairs of bitlines to be in a precharged and equalized state;
precharging and equalizing a plurality of sense amplifiers by using the sense amplifier precharge blocks, each sense amplifier being coupled to one of the complementary pairs of bitlines;
activating one of the wordlines, the wordline being coupled to a plurality of memory cells, each memory cell being coupled to one bitline in each of the pairs of bitlines;
activating the plurality of sense amplifiers;
coupling a first one of the sense amplifiers to a primary data line;
inactivating the wordline;
isolating each of the complementary pairs of bitlines from the plurality of sense amplifiers;
precharging the complementary pairs of bitlines; and
after precharging the complementary pairs of bitlines and while maintaining the active state of the sense amplifiers, coupling a second one of the sense amplifiers to the primary data line.

26. The method of claim 25 wherein coupling a first one of the sense amplifiers to the primary data line further comprises sequentially coupling different ones of the sense amplifiers to the primary data line.

27. The method of claim 25 and further comprising writing data from the primary data line to at least one of the sense amplifiers.

28. The method of claim 27 wherein writing data from the primary data line further comprises coupling the sense amplifier to the complementary pair of bitlines and activating one of the wordlines.

29. The method of claim 27 wherein the written data is applied to a memory cell without activation of a dirty bit.

30. The method of claim 25 wherein activating the plurality of sense amplifiers comprises applying power to the sense amplifiers.

31. The method of claim 25 and further comprising, after coupling a second one of the sense amplifiers to the primary data line, precharging and equalizing the plurality of sense amplifiers with the sense amplifier precharge blocks.

32. The method of claim 31 wherein activating the plurality of sense amplifiers comprises applying power to the sense amplifiers and wherein the power is maintained until the onset of the step of precharging and equalizing the plurality of sense amplifiers with the sense amplifier precharge blocks.

33. The method of claim 25 wherein the array is arranged in a plurality of blocks, each block having a plurality of rows coupled to a stripe of sense amplifiers, wherein memory cells in a second one of the blocks are accessed while the stripe of sense amplifiers in a first one of the blocks maintains data from memory cells in the first one of the blocks.

34. The method of claim 33 wherein the memory cells in the second one of the blocks are read from while the stripe of sense amplifiers in the first one of the blocks maintains data.

35. The method of claim 33 wherein the memory cells in the second one of the blocks are written to while the stripe of sense amplifiers in the first one of the blocks maintains data.

* * * * *